(12) United States Patent
Liao

(10) Patent No.: US 12,055,974 B2
(45) Date of Patent: Aug. 6, 2024

(54) BRACKET

(71) Applicant: Qianhai Junda (Shenzhen) Equity Investment Co., Ltd., Shenzhen (CN)

(72) Inventor: Zhuowen Liao, Shenzhen (CN)

(73) Assignee: Qianhai Junda (Shenzhen) Equity Investment Co., Ltd., Shenzhen (CN)

( * ) Notice: Subject to any disclaimer, the term of this patent is extended or adjusted under 35 U.S.C. 154(b) by 170 days.

(21) Appl. No.: 17/724,604

(22) Filed: Apr. 20, 2022

(65) Prior Publication Data
US 2022/0244759 A1    Aug. 4, 2022

Related U.S. Application Data

(63) Continuation of application No. PCT/CN2020/115121, filed on Sep. 14, 2020.

(51) Int. Cl.
*G06F 1/16*    (2006.01)

(52) U.S. Cl.
CPC .................. *G06F 1/1632* (2013.01)

(58) Field of Classification Search
CPC ...... G06F 1/1632; G06F 1/1626; G06F 1/166; G06F 3/0213; G06F 3/0208; H05K 7/14
See application file for complete search history.

(56) References Cited

U.S. PATENT DOCUMENTS

| | | | | |
|---|---|---|---|---|
| 5,255,214 A * | 10/1993 | Ma | ........................ | F16M 11/10 |
| | | | | 361/679.55 |
| 6,262,885 B1 * | 7/2001 | Emma | ................... | G06F 1/1618 |
| | | | | 361/679.05 |
| 6,464,195 B1 * | 10/2002 | Hildebrandt | .......... | G06F 1/1683 |
| | | | | 248/920 |
| 6,999,008 B2 * | 2/2006 | Wang | .................... | G06F 3/0231 |
| | | | | 345/169 |

(Continued)

FOREIGN PATENT DOCUMENTS

| CN | 202647093 U | 1/2013 |
|---|---|---|
| CN | 203588147 U | 5/2014 |

(Continued)

OTHER PUBLICATIONS

Internation Search Report of PCT/CN2020/115121, Mailed Jun. 11, 2021.

*Primary Examiner* — Anthony M Haughton
*Assistant Examiner* — Theron S Milliser

(57) ABSTRACT

A bracket and an electronic device are provided. The bracket includes a support mechanism and a keyboard. The support mechanism includes a fixed plate and a support seat rotatably connected to the fixed plate. The fixed plate is provided with a fixed surface and a mounting surface. The fixed surface and the mounting surface are respectively located on both sides of the fixed plate which are opposite each other, and the fixed surface can be detachably connected to the electronic equipment. The keyboard is connected to the (Continued)

support seat and is used for inputting data to the electronic device. The electronic equipment such as tablet computer or mobile phone can be detachably set on the fixed surface to support the electronic equipment. Users can input data to the electronic equipment through the operation keyboard without touching the screen of the electronic equipment, which is convenient for users to operate.

7 Claims, 5 Drawing Sheets

(56) References Cited

U.S. PATENT DOCUMENTS

| | | | |
|---|---|---|---|
| 7,327,560 B1 | 2/2008 | Tabasso | |
| 7,450,031 B2* | 11/2008 | Wang | G06F 3/0202 |
| | | | 341/26 |
| 7,479,902 B2* | 1/2009 | Wang | G06F 1/1632 |
| | | | 345/169 |
| 7,884,803 B2* | 2/2011 | Huang | G06F 3/0221 |
| | | | 345/169 |
| 8,467,184 B2* | 6/2013 | Chen | G06F 1/162 |
| | | | 361/679.55 |
| 10,001,242 B2* | 6/2018 | van Hooft | A47B 23/04 |
| 10,671,121 B2* | 6/2020 | Zhu | G06F 1/1637 |
| 10,760,728 B1* | 9/2020 | Maalouf | G06F 3/03547 |
| 10,890,944 B1* | 1/2021 | Tien | G06F 1/1666 |
| 10,955,875 B2* | 3/2021 | Zhu | G06F 3/0202 |
| 2004/0001047 A1* | 1/2004 | Wang | G06F 1/1632 |
| | | | 345/168 |
| 2004/0075588 A1* | 4/2004 | Wang | G06F 1/1632 |
| | | | 361/679.08 |
| 2004/0195305 A1* | 10/2004 | Dotson | H01H 13/86 |
| | | | 235/145 R |
| 2006/0071820 A1 | 4/2006 | Wang et al. | |
| 2006/0077074 A1* | 4/2006 | Wang | H01H 13/86 |
| | | | 341/26 |
| 2006/0192689 A1* | 8/2006 | Wang | G06F 3/0231 |
| | | | 341/22 |
| 2008/0174559 A1* | 7/2008 | Huang | H01H 13/86 |
| | | | 345/169 |
| 2012/0229962 A1* | 9/2012 | Chen | G06F 1/162 |
| | | | 361/679.01 |
| 2015/0286248 A1* | 10/2015 | Sony | F16M 11/38 |
| | | | 248/371 |
| 2017/0009934 A1* | 1/2017 | van Hooft | G06F 1/1616 |
| 2020/0089276 A1* | 3/2020 | Zhu | G06F 1/1637 |
| 2020/0241598 A1* | 7/2020 | Zhu | H01R 24/66 |
| 2022/0244757 A1* | 8/2022 | Liao | H05K 7/1452 |

FOREIGN PATENT DOCUMENTS

| | | |
|---|---|---|
| CN | 103916500 A | 7/2014 |
| CN | 203720721 U | 7/2014 |
| CN | 208227107 U | 12/2018 |

* cited by examiner

BRACKET

TECHNICAL FIELD

The present disclosure relates to the field of electronic technical equipment, in particular to a bracket and an electronic device.

BACKGROUND

With the wide use of smart phones and tablets in electronic devices, the supporting brackets have been widely used.

At present, the common brackets in the market generally only have the support function, that is, they can only realize mechanical support for electronic equipment, so that there is a suitable relative position between electronic equipment and users.

However, when it requires to operate the electronic equipment fixed on the bracket, it is necessary to click the screen of the electronic equipment, which often leads to unstable support and inconvenient operation.

SUMMARY

The object of the embodiment of the present disclosure is to provide a bracket, which aims to solve the problem of unstable support and inconvenient operation when operating the electronic equipment fixed on the bracket.

In order to achieve the above object, the technical solution adopted by the present disclosure is to provide a bracket for fixing electronic equipment, which includes:

A support mechanism, including a fixed plate and a support seat rotatably connected to the fixed plate, wherein the fixed plate is provided with a fixed surface and a mounting surface, the fixed surface and the mounting surface are respectively located on surfaces of both sides of the fixed plate which are opposite each other, and the fixed surface is detachably connected to the electronic equipment;

A keyboard, connected to the support seat and configured for inputting data to the electronic device.

In one embodiment, the keyboard is rotatably connected to the support seat.

In one embodiment, the keyboard includes a key part and a touch part, the key part is capable of inputting data to the electronic device through keys, and the touch part is capable of inputting data to the electronic device through touching.

In one embodiment, the support seat is provided with a mounting cavity and is further provided with an electrical connection hole communicated to the mounting cavity; the bracket further includes an electrical connection mechanism, wherein the electrical connection mechanism includes an electrical connector connected to the fixed plate and an adapter located in the mounting cavity and arranged opposite to the electrical connection hole, and the electrical connector, the adapter and the keyboard are electrically connected; the electrical connector is capable of electrically connecting with the electronic equipment, and the adapter is configured for electrical plug-in of external electronic devices to electrically connect the electronic devices to the electronic equipment.

In one embodiment, the support mechanism further includes a rotation assembly, the rotation assembly includes a first rotating part connected to the mounting surface and a second rotating part connected to the support seat, the first rotating part is rotatably connected to the second rotating part, and the first rotating part is capable of rotating a predetermined angle relative to the second rotating part to adjust an orientation of the fixed surface.

In one embodiment, the first rotating part includes a first rotating shaft rotatably connected to the second rotating part and a second rotating shaft with one end connected to the mounting surface and the other end connected to the first rotating shaft, and a rotating axis of the second rotating shaft is staggered with a rotating axis of the first rotating shaft.

In one embodiment, the electrical connection mechanism further includes a second adapter seat connected to the fixed plate and electrically connected to the electrical connector.

In one embodiment, the support seat includes a support bottom plate and a side support plate rotatably connected to the support bottom plate, the fixed plate is rotatably connected to the side support plate, and the keyboard is rotatably connected to the support bottom plate.

In one embodiment, the support bottom plate is provided with an accommodation slot, the side support plate is accommodated in the accommodation slot by rotating relative to the support bottom plate, the fixed plate is attached to the support bottom plate by rotation, and the keyboard is attached to the support bottom plate by rotation.

In one embodiment, the side support plate is capable of adjusting a length through telescopic deformation.

In one embodiment, the side support plate includes a first side plate rotatably connected to the support bottom plate and a second side plate rotatably connected to the fixed plate; the first side plate is slidably connected to the second side plate and is capable of adjusting a distance between the fixed plate and the second side plate by sliding towards or away to the second side plate.

In one embodiment, the fixed surface is connected to the electronic device through magnetic attraction.

In one embodiment, the fixed plate is provided with an avoidance hole for avoiding a camera of the electronic device.

In one embodiment, the electrical connector is a probe capable of abutting with a contact of the electronic device.

An electronic device is further provided by the present disclosure, including a bracket described above, the electronic device further includes an electronic equipment, and the bracket is used to support the electronic equipment.

The advantageous effect of the present disclosure is that the electronic equipment such as tablet computer or mobile phone can be detachably arranged on the fixed surface to realize the support of the electronic equipment. The keyboard is connected to the support seat and connected to the signal of the electronic equipment, and can input data to the electronic equipment, so that the user can input data to the electronic equipment through operating the keyboard without touching the screen of the electronic equipment, and there will be no unstable support of the support to the electronic equipment, which is convenient for users to operate and save time.

BRIEF DESCRIPTION OF THE DRAWINGS

In order to more clearly illustrate the technical solution in the embodiment of the present disclosure, the following will briefly introduce the attached drawings that need to be used in the embodiment or the description of the prior art. It is obvious that the attached drawings in the following description are only some embodiments of the present disclosure. For those skilled in the art, other attached drawings can be obtained according to these drawings without paying creative labor.

Wherein the reference numerals in the figure are.

Figure 1:
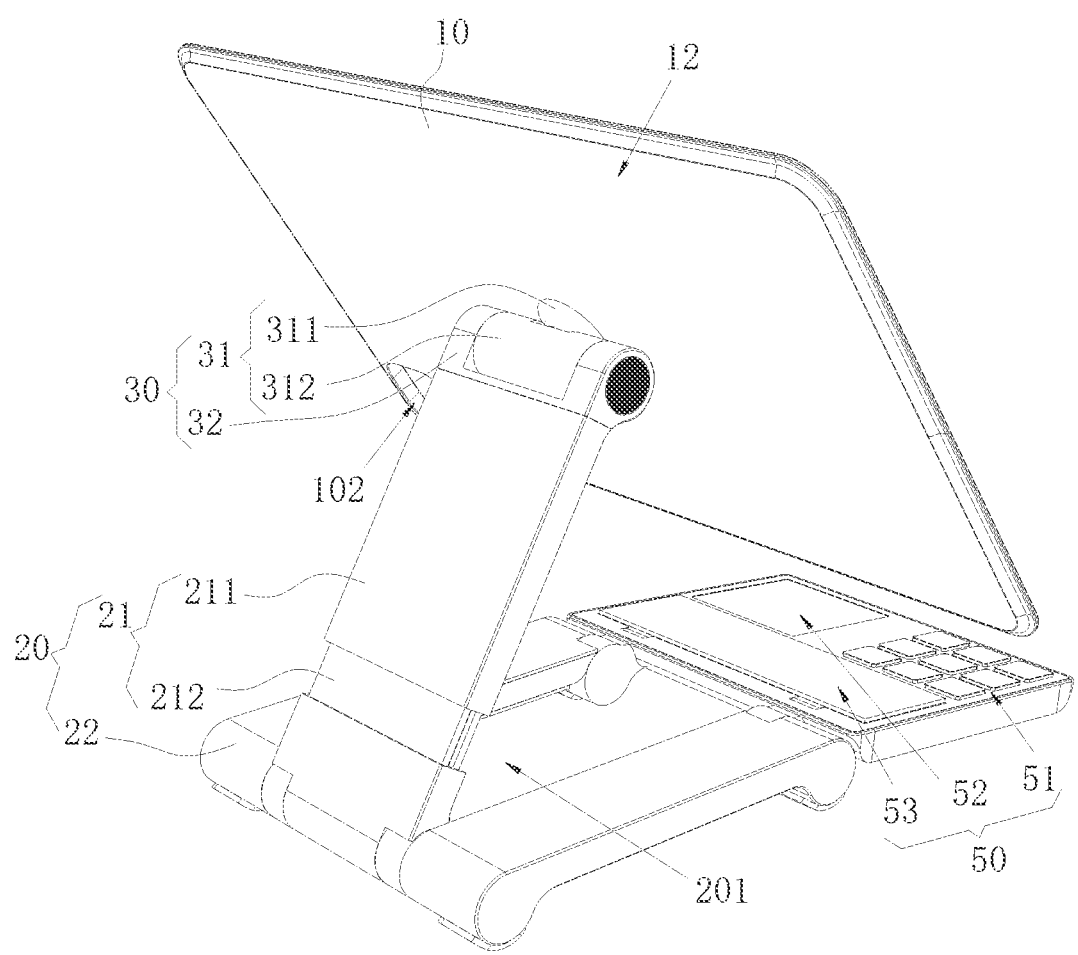
FIG. 1 is a three-dimensional structural view of a bracket provided by an embodiment of the present disclosure.

10. fixed plate; 101. electrical connection hole; 102. avoidance hole; 11. fixed surface; 12. mounting surface; 20. support seat; 201. accommodation slot; 21. side support plate; 211. first side plate; 212. second side plate; 22. support bottom plate; 30. rotation assembly; 31. first rotating part; 311. first rotating shaft; 312. second rotating shaft; 32. second rotating part; 41. electrical connector; 42. adapter; 50. keyboard; 51. key part; 52. touch part; 53. storage part; mounting cavity 100.

DETAILED DESCRIPTION OF THE EMBODIMENTS

In order to make the technical problems to be solved, technical solution and advantageous effects more clear, the present disclosure is further described in detail below in combination with the attached drawings and embodiments. It should be understood that the specific embodiments described herein are only used to explain the present disclosure and are not intended to limit the present disclosure.

It should be noted that when an element is called "fixed to" or "provide on" another element, it can be directly or indirectly on another element. When an element is called "connected" to another element, it can be directly connected to another element or indirectly connected to another element.

It should be understood that the azimuth or positional relationship indicated by the terms "vertical", "horizontal", "inner" and "outer" is based on the azimuth or positional relationship shown in the attached drawings, which is only for the convenience of describing the present disclosure and simplifying the description, rather than indicating or implying that the device or element must have a specific azimuth, be constructed and operated in a specific azimuth, so it cannot be understood as a limitation on the present disclosure.

In addition, the terms "first" and "second" are only used for descriptive purposes and cannot be understood as indicating or implying relative importance or implicitly indicating the number of indicated technical features. Thus, the features defined with "first" and "second" can explicitly or implicitly include one or more of the features. In the description of the present disclosure, "a plurality of" means two or more, unless otherwise specifically defined. Referring to the drawings, the embodiment of the present disclosure provides a bracket for fixing electronic equipment. Optionally, the electronic device is a mobile phone or tablet. In this embodiment, the electronic device is a tablet, especially a tablet with a contact for electrical connection on the bottom.

The bracket includes a support mechanism, a keyboard 50 and an electrical connection mechanism.

Figure 2:
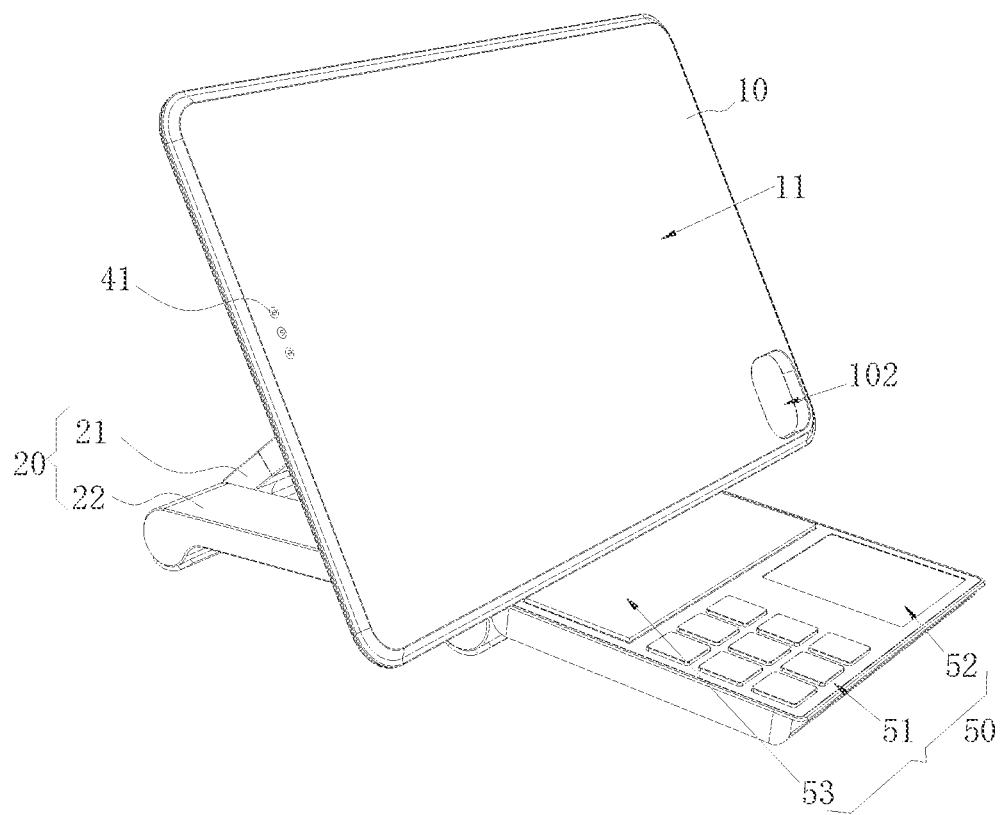
FIG. 2 is a three-dimensional structural view of the bracket in FIG. 1 from another perspective.

Please refer to FIG. 1 and FIG. 2. The support mechanism includes a fixed plate 10 and a support seat 20 supporting the fixed plate 10. The fixed plate 10 is provided with a fixed surface 11 and a mounting surface 12. The fixed surface 11 and the mounting surface 12 are respectively located on the surfaces on both sides of the fixed plate 10 which are opposite each other. The fixed surface 11 can be detachably connected to electronic equipment. Optionally, in the process of use, the fixed surface 11 is arranged facing the user. In this embodiment, the fixed plate 10 can connect the electronic equipment through magnetic attraction. Specifically, the fixed plate 10 has magnetic force, and the electronic equipment can be attached on the fixing surface 11 through magnetic attraction, so as to realize the detachable connection between the electronic equipment and the fixed parts. The size of the fixed plate 10 can match with the bottom surface of the electronic equipment to facilitate alignment for the user. However, electronic devices such as tablet computers are generally equipped with cameras. Wherein the fixed plate 10 is provided with an avoidance hole 102 for avoiding the camera of the electronic device. During installation, the camera can directly align to the avoidance hole 102, so that the electronic device can also shoot when it is set on the fixed plate 10.

Referring to FIGS. 1 and 2, the keyboard 50 is connected to the support seat and is used to input data to the electronic device. The keyboard 50 is connected to the electronic device though signals. Optionally, the keyboard 50 and the electronic device can transmit data through wireless connection. In this embodiment, the keyboard 50 and the electronic device can transmit data through wired connection. Wherein, the keyboard 50 and the electronic device can be connected to each other through external wires or through electrical connection mechanism. The wiring of the electrical connection mechanism is located in the holding cavity inside the support mechanism to prevent messy external wires from occupying space.

In order to improve the flexibility of the operation of the keyboard 50, the keyboard 50 is rotatably connected to the support seat, so as to facilitate the user to adjust the operation angle and facilitate the storage of the support.

The electronic device such as tablet computer or mobile phone is detachably arranged on the fixed surface to support the electronic device. The keyboard 50 is connected to the support seat and connected to the electronic device through signals, and can input data to the electronic device. In this way, the user can input data to the electronic device through operating the keyboard 50 without touching the screen of the electronic device, and there will be no unstable support of the bracket to the electronic device, which is easy for users to operate, convenient and fast. The keyboard 50 is connected to the support mechanism to prevent the keyboard 50 from being lost and is easy to carry.

Referring to FIG. 1 and FIG. 2, in one embodiment, the keyboard 50 may include a key part 51 and a touch part 52. The key part 51 is provided with a plurality of keys, and key part 51 can input data to the electronic device through the keys. The touch part 52 is provided with a touch pad, and the touch part 52 can input data to the electronic device through touching the touch pad. This increases the data input mode of the keyboard 50 and improves the user experience. Wherein the keys can be number keys, letter keys, volume control keys, fast forward and fast backward keys, toggle keys, etc.

Referring to FIGS. 1 and 2, in one embodiment, the keyboard 50 may also include a storage part 53, which is provided with a storage slot to facilitate the placement of a stylus or other components.

Figure 3:
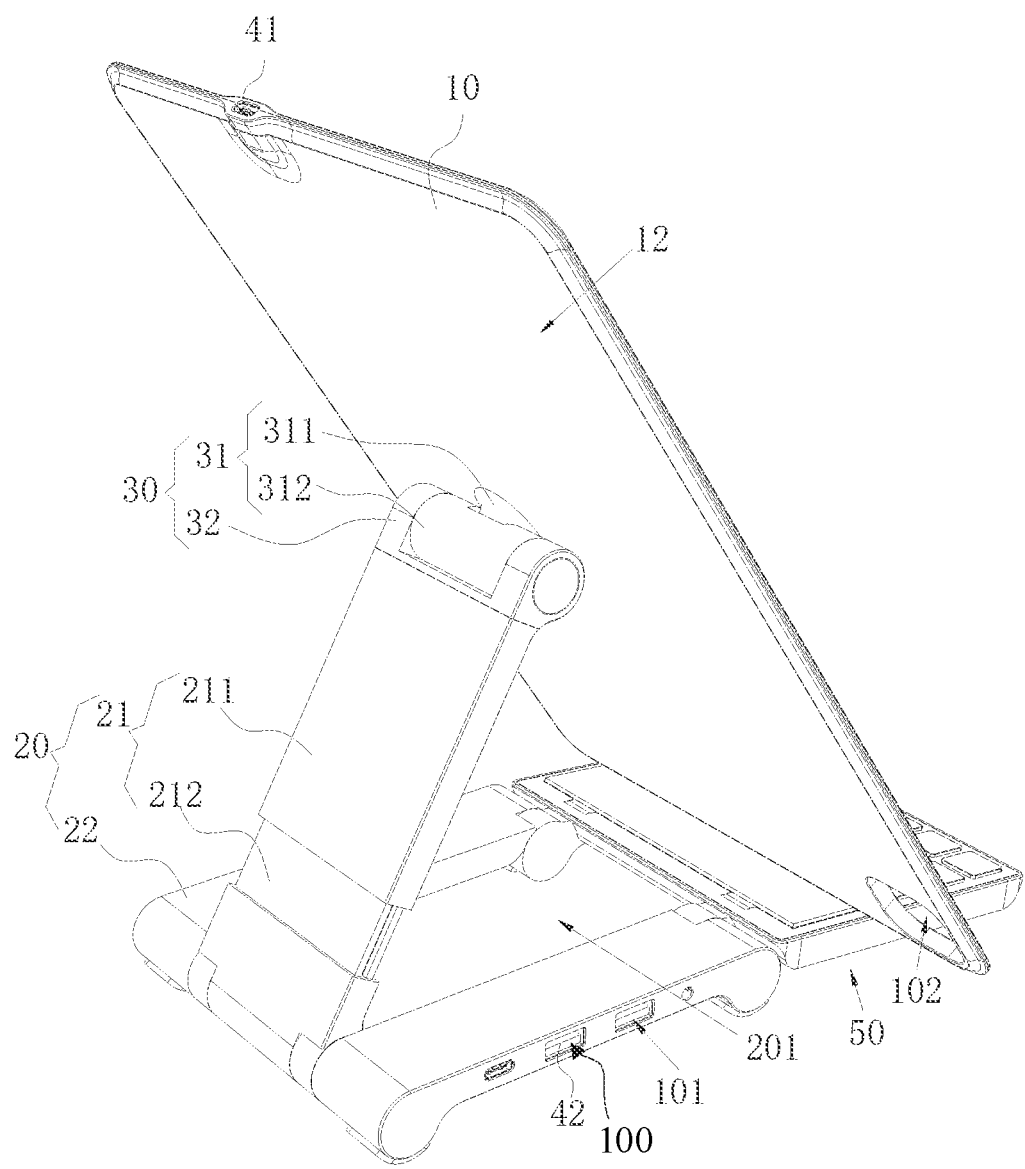
FIG. 3 is a three-dimensional structure view of the bracket provided by another embodiment of the present disclosure.
Figure 4:
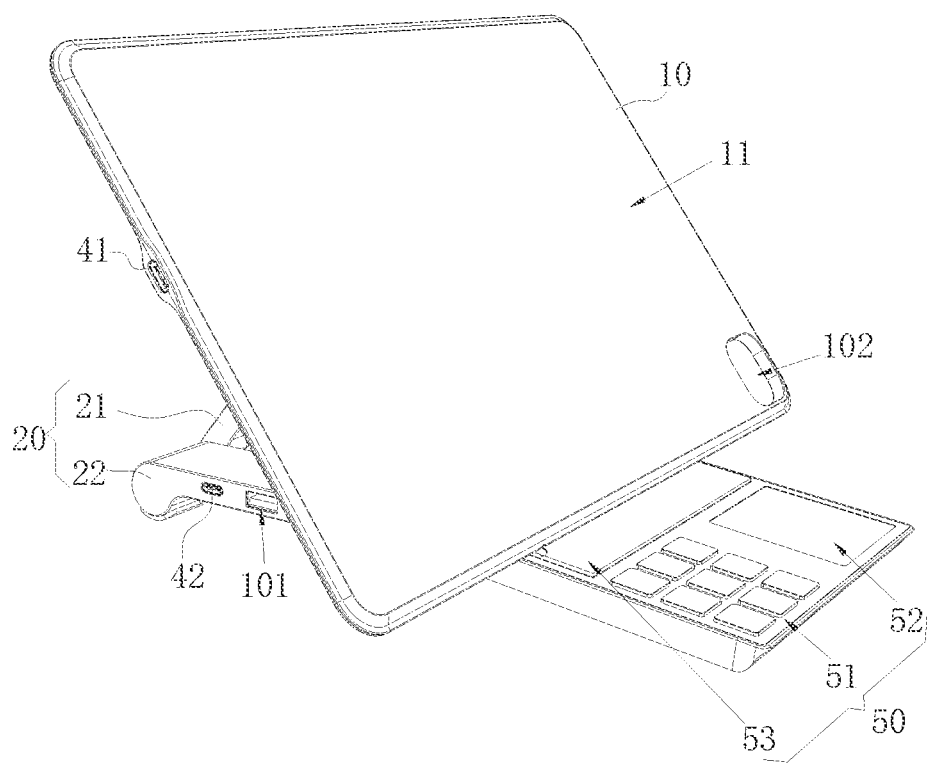
FIG. 4 is a three-dimensional structural view of the bracket in FIG. 3 from another perspective.

Referring to FIGS. 3 to 4, the support seat 20 is provided with a mounting cavity 100 and is provided with an electrical connection hole 101 communicated with the mounting cavity 100. The electrical connection mechanism includes an electrical connector 41 connected to the fixed plate 10 and an adapter 42 located in the mounting cavity 100 and arranged opposite to the electrical connection hole 101. The electrical connector 41, the adapter 42 and the keyboard 50 are electrically connected. The electrical connector 41 can be electrically connected to the electronic equipment. The adapter 42 is used for the electrical plug-in of external electronic devices to electrically connect the electronic devices to the electronic equipment. Wherein the electrical connector 41 may be a plug-in connector. Please refer to FIG. 2, the electrical connector 41 may also be a probe abutted with the contact of the electronic equipment. The position of the probe corresponds to the contact position. The probe realizes the electrical connection between the electronic equipment and the adapter 42 through contact with the contact. In this way, the user can realize the electrical connection between the fixed plate 10 and the adapter 42 by placing the electronic equipment on the fixed plate 10 for one step operation, which is fast and convenient. Referring to FIG. 4, the electrical connector 41 can also be a plug-in interface, which is electrically connected to the electronic equipment through external wires. It should be noted that the external electronic device may be a power supply, server, keyboard 50, memory, receiver or other data transmission device.

The electronic equipment is electrically connected to the adapter 42 through the electrical connector 41. The adapter 42 can be used for the electrical connection of external electronic devices, such as power supply or data transmission device. The support mechanism plays a role in support and switch function on the electronic equipment without directly connecting the wire to the electronic equipment, which facilitates the taking and placing of the electronic equipment. Besides, since the height of the adapter 42 is low, so as to reduce the occupation of the wire to the space. The bracket combines the functions of the adapter to enriches the functions of bracket.

Optionally, the adapter 42 includes a circuit board and a first adapter seat. The circuit board is electrically connected to the electrical connector 41, the first adapter seat is arranged opposite to the electrical connection hole 101, and the first adapter seat is used for electrical plug-in of external electronic devices to realize the electrical connection between the tablet computer and external electronic devices. Wherein, there are a plurality of first adapter seats, which are one of USB-Type-C interface seat, USB-Type-B interface seat, TF card interface seat, audio interface seat and HDMI interface seat respectively. In this embodiment, the adapter 42 includes different types of interface seats to improve the applicability of the bracket and realize the switch of electronic equipment without adding other adapter, which saves space and is convenient for users.

In order to further enrich the function of the bracket, the electrical connection mechanism also includes a second adapter seat connected to the fixed plate 10 and electrically connected with the electrical connector 41. The second adapter seat can also be used for electrical connection with electronic equipment or external electronic devices. When the electronic equipment is an electronic equipment without contact, the second adapter seat can be electrically connected with the electronic equipment through a plug-in wire.

Referring to FIG. 1 and FIG. 3, in order to adjust the orientation of the electronic equipment, the support mechanism also includes a rotating assembly 30. The rotating assembly 30 includes a first rotating part 31 connected to the mounting surface 12 and a second rotating part 32 connected to the support seat 20. The first rotating part 31 is rotatably connected to the second rotating part 32, and the first rotating part 31 rotates a predetermined angle relative to the second rotating part 32 to adjust the orientation of the fixed surface 11. Alternatively, the plane determined by the rotation direction of the first rotating part 31 is vertically. By the rotation of the first rotating part 31, the included angle between the fixed surface 11 and the horizontal plane can be adjusted, so as to adjust the relative position between the tablet and the user, which is convenient for the user to operate the tablet.

The tablet is set on the fixed surface 11, by rotating the first rotating part 31 relative to the second rotating part 32, so as to adjust the relative position between the tablet and the user. And the electrical connection between the power supply or server and the tablet can be realized through the adapter 42, so as to enrich the use function of the bracket. By setting the tablet at one time, the mechanical support and electrical switch of the tablet can be realized and the operation process can be simplified.

Referring to FIGS. 1 and 3, in one embodiment, the first rotating part 31 includes a first rotating shaft 311 rotatably connected to the second rotating part 32 and a second rotating shaft 312 with one end connected to the mounting surface 12 and the other end connected to the first rotating shaft 311. The rotating axis of the second rotating shaft 312 is staggered with the rotating axis of the first rotating shaft 311. The rotational connection between the first rotating shaft 311 and the second rotating shaft 312 realizes the rotation of the fixed plate 10 in its plane.

In one embodiment, the rotation axis of the first rotating shaft 311 is arranged perpendicular to the rotation axis of the second rotating shaft 312, so that the rotation plane of the fixed plate 10 is always perpendicular to the plane of its up and down swing, which more fits the use habits of people. Alternatively, one end of the second rotating shaft 312 is screwed on the shaft side of the first rotating shaft 311 to facilitate the installation and disassembly of the first rotating shaft 311 and the second rotating shaft 312.

Referring to FIGS. 1 and 3, in one embodiment, the support seat 20 includes a support bottom plate 22 and a side support plate 21 rotatably connected to the support bottom plate 22. One end of the side support plate 21 is connected to the support bottom plate 22, the other end of the side support plate 21 is connected to the adapter plate, and the keyboard 50 is rotatably connected to the support bottom plate 22. The fixed plate 10 is rotatably connected to the side support plate 21. When in use, the support bottom plate 22 is supported on the support surface, and the keyboard 50 can be basically placed flat on the support surface. The height of the fixed plate 10 can be adjusted by rotating the side support plate 21 relative to the support bottom plate 22 to meet the requirements for the use height.

Figure 5:
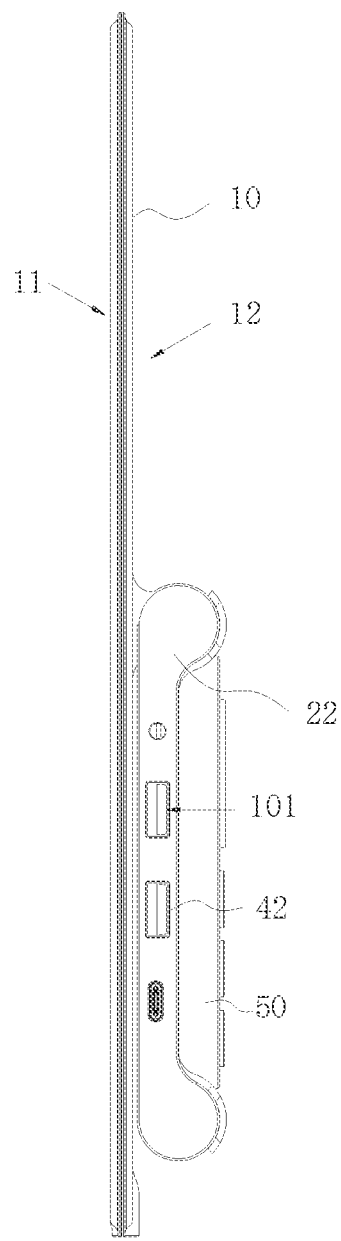
FIG. 5 is a side view of the bracket in the folded state.

Referring to FIG. 3 and FIG. 5, in order to facilitate storage, the support bottom plate 22 is provided with an accommodation slot 201. The side support plate 21 can be accommodated in the accommodation slot 201 by rotating relative to the support bottom plate 22, the fixed plate 10 can be attached to the support bottom plate 22 by rotation, and the keyboard 50 can be attached to the support bottom plate 22 by rotation. In this way, when the bracket is not in use, the fixed plate 10 and the keyboard 50 can be attached to the support bottom plate 22 by rotating and folding, and the bracket can be compressed together to form a folded state for storage, so as to reduce the occupied space and be more portable. The accommodation slot 201 is provided as a through slot to increase the accommodation space.

In order to increase the support height of the bracket, the side support plate 21 can adjust the length through telescopic deformation. When the side support plate 21 is extended, the adjustment range of the fixed plate 10 is larger. When storage is required, it is only necessary to retract the side support plate 21 back to the original state.

Referring to FIGS. 1 and 3, specifically, the side support plate 21 includes a first side plate 211 rotatably connected to the support bottom plate 22 and a second side plate 212 rotatably connected to the fixed plate 10. The first side plate 211 is slidably connected to the second side plate 212 and can adjust the distance between the fixed plate 10 and the second side plate 212 by sliding towards or away from the second side plate 212. The side support plate 21 realizes telescopic deformation through the sliding connection between the first side plate 211 and the second side plate 212, and the structure is simple and easy to process.

The present disclosure also provide an electronic device, which includes a bracket. The specific structure of the bracket refers to the above embodiment. Since the electronic device adopts all the technical solutions of all the above embodiments, it also has all the advantageous effects brought by the technical solutions of the above embodiment, which will not be described detailed here for brevity.

In one embodiment, the electronic device also includes a tablet computer, and the bracket is used to support the tablet computer for the user to operate the tablet computer.

The description above is only the preferred embodiment of the present disclosure and should not regard as a limitation to the present disclosure. Any modification, equivalent substitution and improvement made within the spirit and principles of the present disclosure shall be included in the scope of the present disclosure.

What is claimed is:

1. A bracket, comprising a support mechanism, comprising a fixed plate and a support seat rotatably connected to the fixed plate, wherein the fixed plate is provided with a fixed surface and a mounting surface, the fixed surface and the mounting surface are respectively located on surfaces of both sides of the fixed plate which are opposite each other;
a keyboard, connected to the support seat
the support seat is provided with a mounting cavity and is further provided with an electrical connection hole communicated to the mounting cavity; the bracket further comprises an electrical connection mechanism, wherein the electrical connection mechanism comprises an electrical connector connected to the fixed plate and an adapter located in the mounting cavity and arranged opposite to the electrical connection hole, and the electrical connector, the adapter and the keyboard are electrically connected, the electrical connector is a probe;
the support seat comprises a support bottom plate and a side support plate rotatably connected to the support bottom plate, the fixed plate is rotatably connected to the side support plate, and the keyboard is rotatably connected to the support bottom plate;
the side support plate is capable of adjusting a length through telescopic deformation;
the side support plate comprises a first side plate rotatably connected to the support bottom plate and a second side plate rotatably connected to the fixed plate; the first side plate is slidably connected to the second side plate and is capable of adjusting a distance between the fixed plate and the second side plate by sliding towards or away to the second side plate.

2. The bracket according to claim 1, wherein the keyboard is rotatably connected to the support seat.

3. The bracket according to claim 2, wherein the keyboard comprises a key part and a touch part.

4. The bracket according to claim 1, wherein the support mechanism further comprises a rotation assembly, the rotation assembly comprises a first rotating part connected to the mounting surface and a second rotating part connected to the support seat, the first rotating part is rotatably connected to the second rotating part, and the first rotating part is capable of rotating a predetermined angle relative to the second rotating part to adjust an orientation of the fixed surface.

5. The bracket according to claim 4, wherein the first rotating part comprises a first rotating shaft rotatably connected to the second rotating part and a second rotating shaft with one end connected to the mounting surface and the other end connected to the first rotating shaft, and a rotating axis of the second rotating shaft is staggered with a rotating axis of the first rotating shaft.

6. The bracket according to claim 1, wherein the support bottom plate is provided with an accommodation slot, the side support plate is accommodated in the accommodation slot by rotating relative to the support bottom plate, the fixed plate is attached to the support bottom plate by rotation, and the keyboard is attached to the support bottom plate by rotation.

7. The bracket according to claim 1, wherein the fixed plate is provided with an avoidance hole.

* * * * *